United States Patent
Seo et al.

(10) Patent No.: US 9,256,528 B2
(45) Date of Patent: Feb. 9, 2016

(54) METHOD FOR OPERATING A MEMORY CONTROLLER AND A SYSTEM HAVING THE MEMORY CONTROLLER

(71) Applicants: SAMSUNG ELECTRONICS CO., LTD., Gyeonggi-do (KR); RESEARCH & BUSINESS FOUNDATION SUNGKYUNKWAN UNIVERSITY, Gyeonggi-do (KR)

(72) Inventors: Dong Young Seo, Suwon-si (KR); Dong Kun Shin, Seoul (KR)

(73) Assignees: SAMSUNG ELECTRONICS CO., LTD., Suwon-Si, Gyeonggi-Do (KR); RESEARCH & BUSINESS FOUNDATION SUNGKYUNKWAN UNIVERSITY, Suwon-Si, Gyeonggi-Do (KR)

( * ) Notice: Subject to any disclaimer, the term of this patent is extended or adjusted under 35 U.S.C. 154(b) by 278 days.

(21) Appl. No.: 13/962,056

(22) Filed: Aug. 8, 2013

(65) Prior Publication Data
US 2014/0047169 A1    Feb. 13, 2014

(30) Foreign Application Priority Data
Aug. 8, 2012    (KR) .................. 10-2012-0086793

(51) Int. Cl.
| G06F 12/14 | (2006.01) |
| G06F 12/02 | (2006.01) |
| G11C 16/10 | (2006.01) |

(52) U.S. Cl.
CPC .......... *G06F 12/0246* (2013.01); *G06F 12/023* (2013.01); *G11C 16/102* (2013.01)

(58) Field of Classification Search
CPC .. G06F 12/0246; G06F 12/023; G11C 16/102
USPC ........................................................ 711/103
See application file for complete search history.

(56) References Cited

U.S. PATENT DOCUMENTS

| 7,437,557 | B2 | 10/2008 | Lee et al. |
| 7,774,390 | B2 | 8/2010 | Shin |
| 7,797,498 | B2 | 9/2010 | Jung et al. |
| 7,996,642 | B1 | 8/2011 | Smith |
| 8,032,724 | B1 | 10/2011 | Smith |
| 8,140,600 | B2 | 3/2012 | Ogasawara |
| 8,892,610 | B1 * | 11/2014 | Pang ............................ 707/813 |
| 2009/0172258 | A1 * | 7/2009 | Olbrich et al. ................ 711/103 |

FOREIGN PATENT DOCUMENTS

| JP | 2006-344184 | 12/2006 |
| JP | 2010-244342 | 10/2010 |
| KR | 1020060037793 | 5/2006 |

* cited by examiner

*Primary Examiner* — Jae Yu
(74) *Attorney, Agent, or Firm* — F. Chau & Associates, LLC

(57) ABSTRACT

A method for operating a memory controller includes determining a number of free blocks to be created during an idle time by using a block consumption history, and controlling a non-volatile memory device to perform a garbage collection operation during the idle time to create the determined number of free blocks.

18 Claims, 17 Drawing Sheets ly collects garbage to reclaim a storage capacity thereof. For example, a
METHOD FOR OPERATING A MEMORY CONTROLLER AND A SYSTEM HAVING THE MEMORY CONTROLLER

CROSS-REFERENCE TO RELATED APPLICATION

This application claims priority under 35 U.S.C. §119 to Korean Patent Application No. 10-2012-0086793 filed on Aug. 8, 2012, the disclosure of which is incorporated by reference herein in its entirety.

BACKGROUND

1. Technical Field

The present inventive concept relates to a memory controller, and more particularly, to a method for operating a memory controller to reclaim a response time of a read operation and a write operation, and a system having the memory controller.

2. Discussion of the Related Art

A non-volatile memory device periodically collects garbage to reclaim a storage capacity thereof. For example, a garbage collection operation is performed by copying, from a block including valid pages and invalid pages, the valid pages into another block and erasing the block including the invalid pages. The erased block is freed up and the erased block may be called a free block.

The non-volatile memory device performs a write operation for writing data in the non-volatile memory device and a read operation for reading data from the non-volatile memory device in response to a write instruction and a read instruction, respectively. When the non-volatile memory device does not have enough free blocks to perform the write operation, a garbage collection operation may be performed before a write operation and a read operation are performed. However, this may delay the write operation and the read operation.

SUMMARY

An exemplary embodiment of the present inventive concept provides a method for operating a memory controller, the method including determining a number of free blocks to be created during an idle time by using a block consumption history, and controlling a non-volatile memory device to perform a garbage collection operation during the idle time to create the determined number of free blocks. The block consumption history includes information regarding a number of blocks consumed before the idle time.

Determining the number of free blocks to be created includes reading, from the block consumption history, information about a number of blocks consumed by write operations during write times, and determining the number of the free blocks to be created based on the read information.

According to an exemplary embodiment of the inventive concept, the method for operating the memory controller may further include receiving a first write request and a second write request, controlling the non-volatile memory device to consume a portion of the created free blocks in response to the first write request, controlling the non-volatile memory device to create one new free block when the number of remaining free blocks is equal to or less than a number of threshold free blocks, and controlling the non-volatile memory device to perform a write operation corresponding to the second write request after the one new free block is created.

According to an exemplary embodiment of the inventive concept, the method for operating the memory controller may further include receiving a first write request before the determined number of free blocks are all created, determining a number of valid pages to be copied-back when the number of free blocks created during the idle time is not as many as the determined number of free blocks to be created during the idle time, controlling the non-volatile memory to collect the determined number of valid pages to be copied-back, and controlling the non-volatile memory device to perform a write operation corresponding to the first write request after the valid pages to be copied-back are collected.

Determining the number of the valid pages to be copied-back includes multiplying a number of average valid pages per victim block by a number of the free blocks which had not been created, and determining a result of the multiplication as the number of the valid pages to be copied-back.

An exemplary embodiment of the present inventive concept provides a memory system, including a non-volatile memory device and a memory controller configured to control the non-volatile memory device.

The memory controller includes a memory storing firmware which determines a number of free blocks to be created during an idle time by using a block consumption history and controls the non-volatile memory device to perform a garbage collection operation during the idle time to create the determined number of free blocks, and a micro-processor configured to execute the firmware. The memory stores the block consumption history. The block consumption history is loaded from the non-volatile memory device to the memory. The firmware is loaded from the non-volatile memory device to the memory.

The non-volatile memory device is a three-dimensional non-volatile memory device. According to an exemplary embodiment of the inventive concept, the memory system may be a handheld electronic device. According to an exemplary embodiment of the inventive concept, the memory system may be a memory card. According to an exemplary embodiment of the inventive concept, the memory system may be a solid state drive.

An exemplary embodiment of the present inventive concept provides a method for operating a controller, including determining a number of free blocks to be created, wherein the number of free blocks to be created is based on used valid blocks; and instructing a non-volatile memory device to create the determined number of free blocks in an idle time.

The valid blocks are used in write operations that occur prior to the idle time.

The idle time is an idle time of the non-volatile memory device.

The method may further include instructing the non-volatile memory device to create one new free block when a number of free blocks remaining after performing a first write operation is less than a predetermined threshold; and instructing the non-volatile memory device to perform a second write operation on the one new free block.

The method may further include receiving a first write request before all of the determined number of free blocks are created; determining a number of valid pages to be copied-back to a block based on a number of free blocks needed to reach the determined number of free blocks; and controlling the non-volatile memory device to perform the first write request on the block.

The free blocks are valid blocks where data may be programmed.

DETAILED DESCRIPTION OF THE EMBODIMENTS

Figure 1:
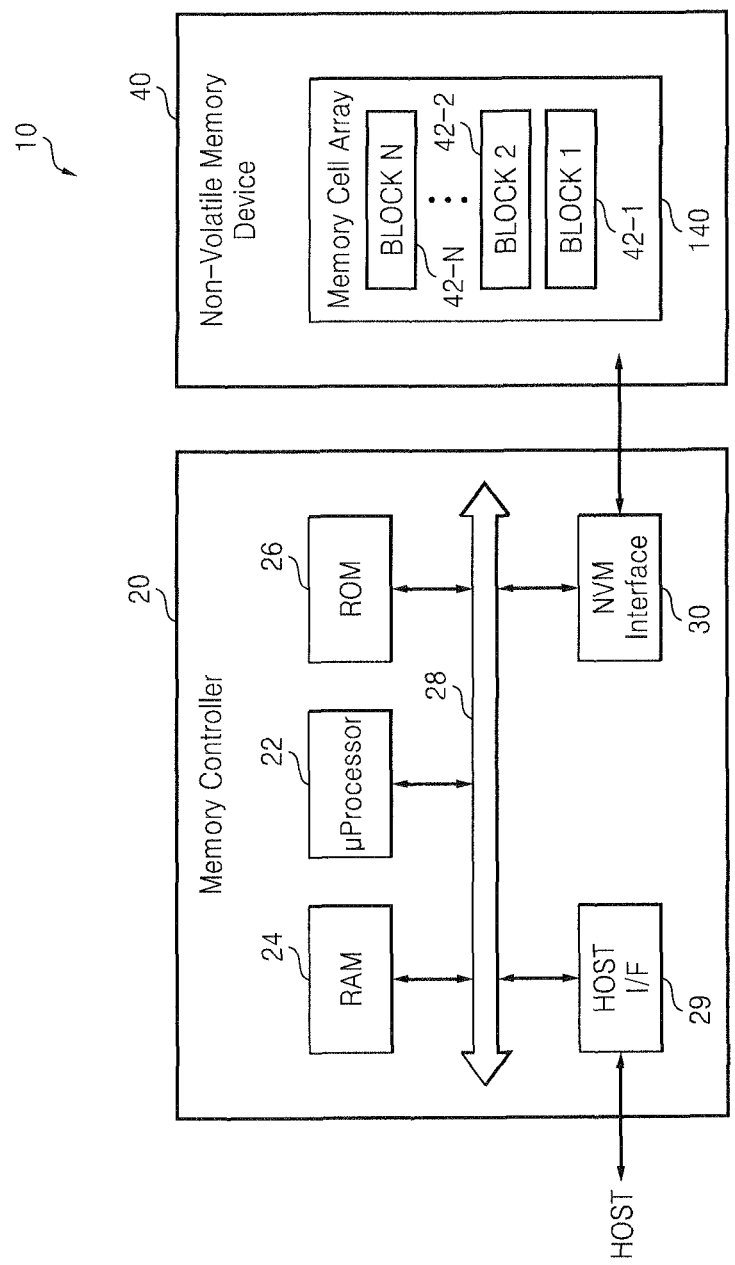
FIG. 1 is a block diagram of a memory system including a memory controller according to an exemplary embodiment of the present inventive concept.
Figure 2:
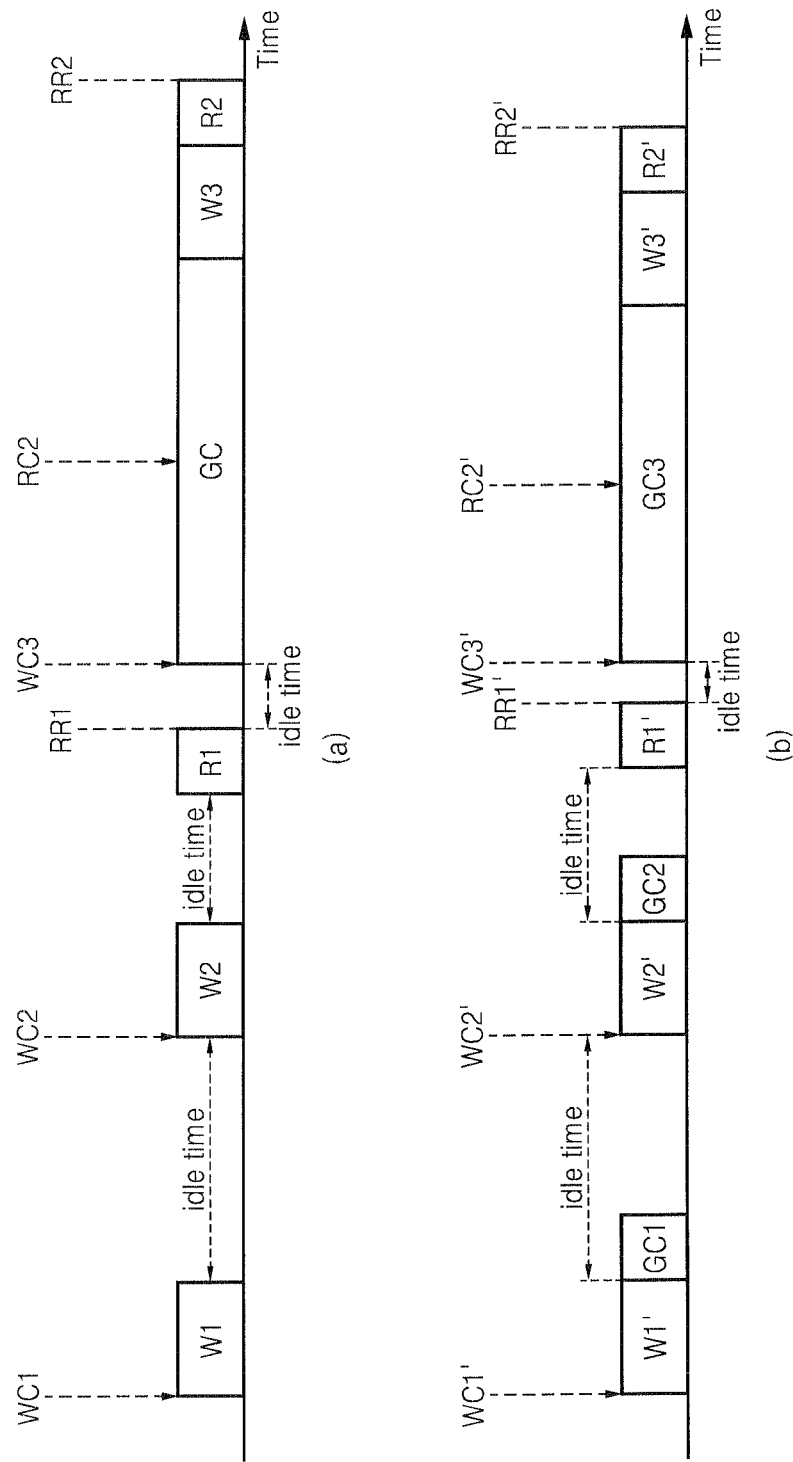
FIG. 2 includes diagrams for explaining a conventional garbage collection operation and a garbage collection operation according to an exemplary embodiment of the present inventive concept.

FIG. 1 is a block diagram of a memory system including a memory controller according to an exemplary embodiment of the present inventive concept. Referring to FIG. 1, a memory system 10 includes a memory controller 20 and a non-volatile memory device 40.

The memory controller 20 controls an operation of the non-volatile memory device 40. An operation of the non-volatile memory device 40 may include a program operation, a read operation, an erase operation and a garbage collection operation. The program operation may be a write operation. The memory controller 20 includes a micro-processor 22, a random access memory (RAM) 24, a read only memory (ROM) 26, a host interface 29, and a memory interface 30. Each element 22, 24, 26, 29 and 30 may communicate with each other through a bus 28.

The micro-processor 22 executes firmware loaded from the RAM 24 or the ROM 26. The micro-processor 22 which may be embodied in a circuit, logic, a code or a combination of these may control an operation of each element 24, 26, 29 and 30.

Firmware for controlling an operation of the non-volatile memory device 40 may be loaded from the non-volatile memory device 40 and temporarily stored in the RAM 24. According to an exemplary embodiment of the present inventive concept, the RAM 24 may be used as a buffer memory to store data transmitted between a host and the non-volatile memory device 40.

In addition, according to an exemplary embodiment of the present inventive concept, the ROM 26 may store firmware for controlling an operation of the non-volatile memory device 40. The firmware includes program instructions and may be flash translation layer (FTL) firmware for controlling a garbage collection operation. The garbage collection operation will be explained in detail with reference to FIGS. 2 through 8.

The host and the memory controller 20 may communicate with each other through the host interface 29. The host may transmit a program request or a write request, and data to be programmed in the non-volatile memory device 40 to the memory controller 20 through the host interface 29. Here, the memory controller 20 may create a page address of a page of the non-volatile memory device 40 where the data will be stored according to the program request or the write request, and/or a word line address corresponding to the page. The memory controller 20 and the non-volatile memory device 40 may communicate with each other through the memory interface 30.

A memory cell array 140 of the non-volatile memory device 40 includes memory blocks 42-1 through 42-N, where N is a natural number, and each of the memory blocks 42-1 through 42-N may be divided into pages (not shown). Valid data or invalid data may be stored in each of the pages. Each of the pages includes non-volatile memory cells, e.g., NAND flash memory cells. Each of the NAND flash memory cells may store one or more bits.

In the non-volatile memory device 40, e.g., the NAND flash memory device, a write operation or a read operation is performed by pages, and an erase operation is performed by blocks.

FIGS. 2A and 2B are diagrams for explaining a conventional garbage collection operation and a garbage collection operation according to an exemplary embodiment of the present inventive concept. Referring to FIGS. 1 and 2A, the memory controller 20 controls write operations W1 and W2 to program data in the non-volatile memory device 40 in response to write requests WC1 and WC2 output from a host.

After each of the write operations W1 and W2 is performed, a garbage collection operation is not performed during an idle time. When the non-volatile memory device 40 does not include enough free blocks for performing a write operation W3 corresponding to a write request WC3, the memory controller 20 controls a garbage collection operation GC before controlling the write operation W3. Accordingly, the non-volatile memory device 40 creates free blocks by performing the garbage collection operation GC before the write operation W3. After the free blocks are created, the write operation W3 is performed. After the write operation W3 is performed, a read operation R2 corresponding to a read request RC2 is performed.

Referring to FIGS. 1 and 2B, the memory controller 20 controls a write operation W1' in response to a write request WC1' output from a host. After the write operation W1' is performed, a garbage collection operation GC1 is performed during an idle time. Similarly, after a write operation W2' corresponding to a write request WC2' is performed, a garbage collection operation GC2 is performed during the idle time. Pages including valid data are copied-back from one block to another block by the garbage collection operations GC1 and GC2. According to an exemplary embodiment of the present inventive concept, free blocks may be created by the garbage collection operations GC1 and GC2.

The memory controller 20 may control a garbage collection operation GC3 before controlling a write operation W3' in response to a write request WC3'. Accordingly, the non-volatile memory device 40 creates free blocks by performing the garbage collection operation GC3 before a write operation W3'. After the write operation W3' is performed, a read operation R2' corresponding to a read request RC2' is performed.

A read response time RR1' corresponding to a read operation R1' illustrated in FIG. 2B is slightly longer than a read response time RR1 illustrated in FIG. 2A. However, a read response time RR2' corresponding to a read operation R2' illustrated in FIG. 2B is considerably shorter than a read response time RR2 illustrated in FIG. 2A. Accordingly, a read response time may be improved by performing a garbage collection operation during an idle time.

Figure 3:
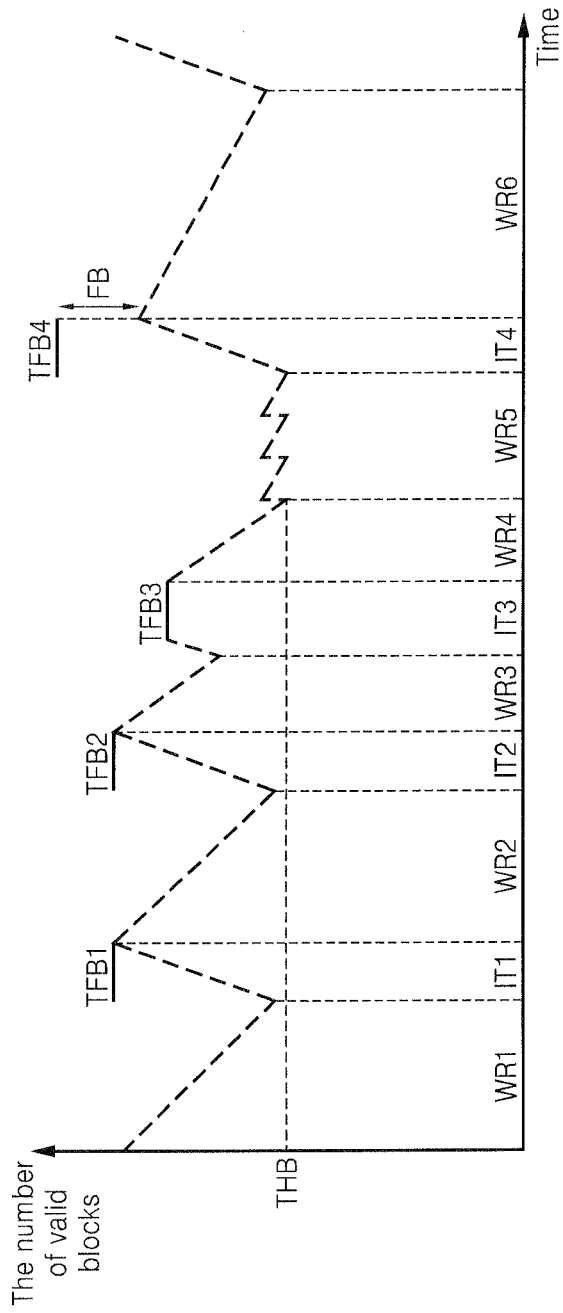
FIG. 3 is a diagram for explaining a method for operating the memory controller illustrated in FIG. 1, according to an exemplary embodiment of the present inventive concept.

FIG. 3 is a diagram for explaining a method for operating the memory controller illustrated in FIG. 1, according to an exemplary embodiment of the present inventive concept. Referring to FIGS. 1 and 3, an idle time IT1 through IT4 may be when the non-volatile memory device 40 does not operate. A write time WR1 through WR6 may be when the non-volatile memory device 40 performs a write operation in response to more than at least one write instruction. The non-volatile memory device 40 may perform write operations in response to a plurality of write instructions during a write time, e.g., WR1.

The non-volatile memory device 40 may perform write operations in response to more than at least one write instruction during a write time WR1, WR2, WR3, WR4, WR5 or WR6. In other words, valid blocks are decreased by programming data in pages included in the blocks 42-1 through 42-N.

After write operations corresponding to the write instructions are performed, the non-volatile memory device 40 becomes idle when the memory controller 20 does not receive a request, e.g., a program request or a write request, a read request or an erase request, from a host.

The non-volatile memory device 40 performs a garbage collection operation creating free blocks as many as the number, e.g., TFB1, of free blocks during an idle time IT1. The free blocks are valid blocks where data may be programmed.

According to an exemplary embodiment of the inventive concept, the number, e.g., TFB1, TFB2, TFB3 or TFB4, of free blocks to be created during an idle time IT1, IT2, IT3 or IT4 may vary. The number, e.g., TFB1, TFB2, TFB3 or TFB4, of free blocks to be created during the idle time IT1, IT2, IT3 or IT4 is adaptively calculated according to a workload. The workload may indicate the number of free blocks consumed by performing write operations.

For example, the number TFB3 of free blocks to be created during the idle time IT3 is determined according to the number of valid blocks consumed by write operations during the write time WR1, the number of valid blocks consumed by write operations during the write time WR2, and the number of valid blocks consumed by write operations during the write time WR3. The number of valid blocks consumed by write operations during the write time WR1 through the write time WR3 may be the same as that shown in Table 1.

TABLE 1

| WR1 | WR2 | WR3 |
|-----|-----|-----|
| 20  | 10  | 15  |

The number TFB3 of free blocks to be created during the idle time IT3 may be determined as an average of the valid blocks consumed in write operations during the write time WR1 through the write time WR3, e.g., (20+10+15)/3=15.

According to an exemplary embodiment of the inventive concept, the number TFB3 of free blocks to be created during the idle time IT3 may be calculated by adding a value, which is calculated by multiplying 15, e.g., the average of the consumed valid blocks, by a weighting of 0.5, and a value, which is calculated by multiplying 15, the number of valid blocks consumed during the write time WR3, by a weighting of 0.5. The number of free blocks to be created during an idle time may be adaptively calculated by using other methods, and is not restricted to the just described method.

A block consumption history includes information regarding the number of valid blocks consumed by write operations during the write time WR1, the number of valid blocks consumed by write operations during the write time WR2, and the number of valid blocks consumed by write operations during the write time WR3. The block consumption history is stored in the memory cell array 140 and loaded on the RAM 24. According to an exemplary embodiment of the present inventive concept, the block consumption history may be stored in the ROM 26.

Figure 4:
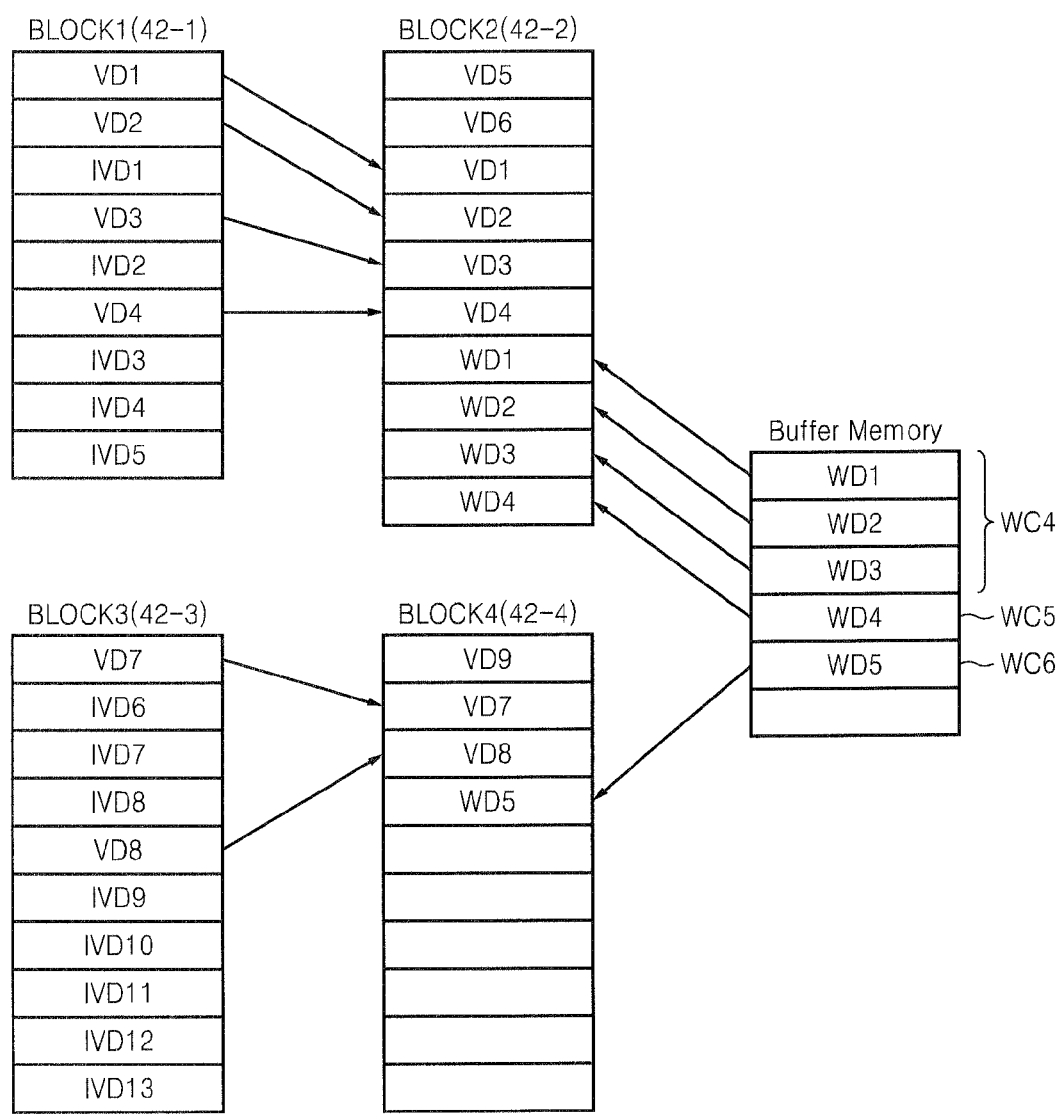
FIG. 4 is a diagram for explaining a garbage collection operation illustrated in FIG. 3, according to an exemplary embodiment of the present inventive concept.

FIG. 4 is a diagram for explaining a garbage collection operation illustrated in FIG. 3, according to an exemplary embodiment of the present inventive concept. Referring to FIGS. 1, 3 and 4, valid blocks are decreased by performing write operations in response to write instructions after the idle time IT3. The number of valid blocks of the non-volatile memory device 40 should be more than a number THB of threshold blocks.

The number TFB3 of free blocks to be created during the idle time IT3 may be incorrectly estimated. When the number of available valid blocks, e.g., the number of the remaining free blocks, is fewer than the number THB of threshold blocks, a garbage collection creating one free block during the write time WR5 is performed and then a write operation is performed. When one valid block is consumed by the write operation, a garbage collection creating another free block again is performed before another write operation is performed.

For example, referring to FIG. 4, when the number of the remaining free blocks is fewer than the number THB of threshold blocks, the memory controller 20 may receive a write request WC4 for writing write data WD1 through WD3 in the non-volatile memory device 40, a write request WC5 for writing write data WD4 in the non-volatile memory device 40, and a write request WC6 for writing write data WD5 in the non-volatile memory device 40 from a host.

A buffer memory, which may temporarily store the data WD1 through WD5, may be the RAM 24 included in the memory controller 20. The number of write data to be written in the non-volatile memory device 40 for one write request WC4, WC5 or WC6 may vary according to an exemplary embodiment of the present inventive concept.

The memory controller 20 controls the non-volatile memory device 40 so that the non-volatile memory device 40 may perform a garbage collection operation before controlling write operations corresponding to the write requests WC4 through WC6. In other words, pages including valid data VD1 through VD4 are copied-back from a first block 42-1 to a second block 42-2, and the first block 42-1 is deleted. Invalid data IVD1 though IVD5 of the first block 42-1 are erased. Then, the first block 42-1 becomes free.

After one free block. e.g., the first block 42-1 is created, a write operation corresponding to the write request WC4 is performed. The write data WD1 through WD3 temporarily stored in the buffer memory is programmed in pages of the second block 42-2.

Since the valid block, e.g., the second block 42-2, is not completely consumed after the write operation corresponding to the write request WC4 is performed, a write operation corresponding to the write request WC5 may be performed. The write data WD4 may be programmed in a page of the valid block 42-2.

Since the valid block 42-2 is completely consumed after the write operation corresponding to the write request WC5 is performed, the memory controller 20 controls a garbage collection operation to create another free block, e.g., a third block 42-3, before controlling the non-volatile memory device 40 so that a write operation corresponding to the write request WC6 may be performed.

The third block 42-3 includes valid data VD7 and VD8 and invalid data IVD6 through IVD13. Pages including the valid data VD7 and VD8 are copied-back from the third block 42-3 to a fourth block 42-4, and the third block 42-3 is deleted. Then, a free block 42-3 is created. The non-volatile memory device 40 performs a write operation corresponding to the write request WC6 after performing the garbage collection operation for generating the free block 42-3. The write data WD5 stored in the buffer memory is programmed in a page of the fourth block 42-4. The garbage collection operation and the write operation are iteratively performed during the write time WR5.

Figure 5:
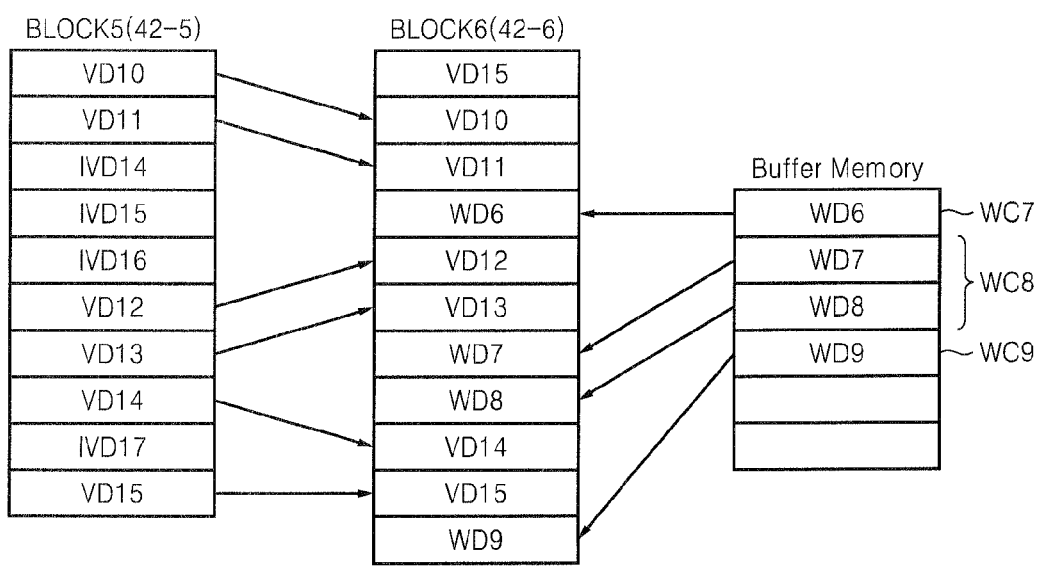
FIG. 5 is a diagram for explaining a garbage collection operation illustrated in FIG. 3, according to an exemplary embodiment of the present inventive concept.

FIG. 5 is a diagram for explaining the garbage collection operation illustrated in FIG. 3, according to an exemplary embodiment of the present inventive concept. Referring to FIGS. 1, 3 and 5, a garbage collection operation is performed to create free blocks as many as the number TFB4 of target free blocks during the idle time IT4. Before enough free blocks are generated to reach the number TFB4 of target free blocks during the idle time 114, the memory controller 20 may receive a write request from a host. Here, the garbage collection operation is interrupted before enough free blocks are created to reach the number TFB4 of target free blocks, and the number FB of free blocks may still need to be created.

For example, referring to FIG. 5, the memory controller 20 receives a write request WC7 for writing write data WD6 in the non-volatile memory device 40, a write request WC8 for writing write data WD7 and WD8 in the non-volatile memory device 40, and a write request WC9 for writing write data WD9 in the non-volatile memory device 40 from a host. Here, the number FB of free blocks is not yet created.

The non-volatile memory device 40 performs a garbage collection operation before performing a write operation corresponding to the write request WC7. After pages including valid data VD10 and VD11 are copied-back from a fifth block 42-5 to a sixth block 42-6, the write data WD6 stored in a buffer memory is programmed in a page of the sixth block 42-6.

The number of valid pages copied-back to the sixth block 42-6 may vary according to an exemplary embodiment of the present inventive concept. For example, the number of valid pages copied-back to the sixth block 42-6 may be a value calculated by multiplying the number FB of free blocks which had not yet been created by a number of average valid pages per victim block, e.g., the number of the average valid pages is six when a victim block 42-5 is one. The victim block may be a block to be deleted by a garbage collection operation.

After a write operation corresponding to the write request WC7 is performed, the non-volatile memory device 40 performs a garbage collection operation before performing a write operation corresponding to the write request WC8. Valid pages including valid data VD12 and VD13 are copied-back from the fifth block 42-5 to the sixth block 42-6. To perform the write operation, the write data WD7 and WD8 stored in the buffer memory are programmed in pages of the sixth block 42-6.

After a write operation corresponding to the write request WC8 is performed, the non-volatile memory device 40 performs a garbage collection operation before performing a write operation corresponding to the write request WC9. Valid pages including valid data VD14 and VD15 are copied-back from the fifth block 42-5 to the sixth block 42-6. The write data WD9 stored in the buffer memory is programmed in the sixth block 42-6. Accordingly, the garbage collection operation is performed to create the number of free blocks FB during the write time WR6.

Figure 6:
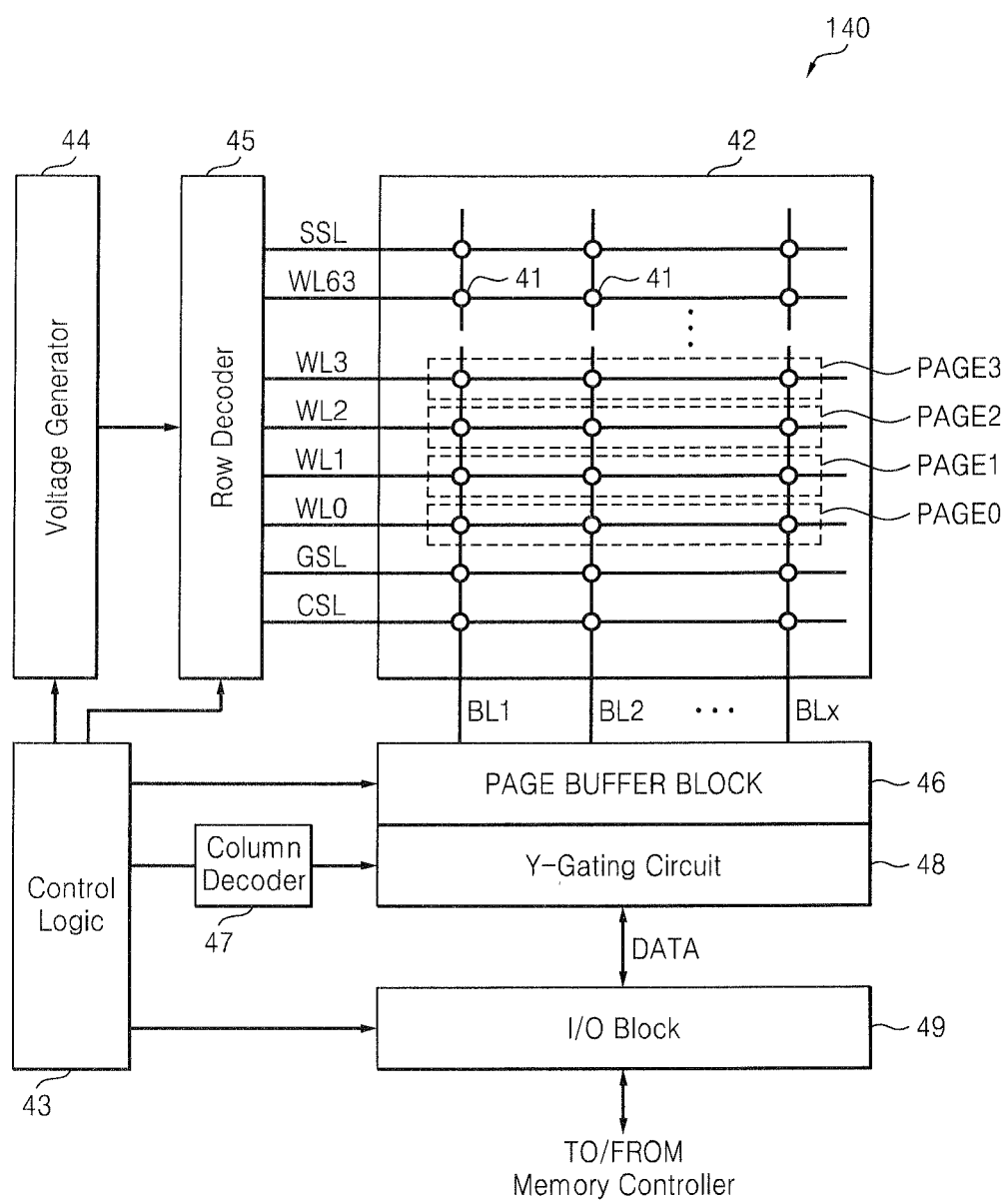
FIG. 6 is a block diagram of a non-volatile memory device which is illustrated in FIG. 1 and has a two-dimensional structure, according to an exemplary embodiment of the present inventive concept.

FIG. 6 is a block diagram of a non-volatile memory device which is illustrated in FIG. 1 and has a two-dimensional structure, according to an exemplary embodiment of the present inventive concept. Referring to FIGS. 1 and 6, the non-volatile memory device 40, e.g., a NAND flash memory device, includes a memory cell array 140 for storing data, a memory block 42, a control logic 43, a voltage generator 44, a row decoder 45, a page buffer block 46, a column decoder 47, a Y-gating circuit 48 and an input/output block 49.

The memory cell array 140 includes a plurality of NAND memory cell strings. Each of the plurality of NAND memory cell strings includes a plurality of NAND memory cells 41 connected in series.

For example, a first NAND memory cell string includes a plurality of NAND memory cells 41 connected in series between a first selection transistor (or a string selection transistor) connected to a bit line BL1 and a second selection transistor (or a ground selection transistor) connected to a common source line CSL.

A gate of the first selection transistor is connected to a string selection line SSL, each gate of the plurality of NAND memory cells 41 is connected to a corresponding one of a plurality of word lines WL0 through WL63, and a gate of the second selection transistor is connected to a ground selection line GSL. When each of the memory cells is a single level cell (SLC), each word line, e.g., WL0 through WL3, may define a page, e.g., PAGE0 through PAGE3.

The memory cell array 140 including 64 word lines WL0 through WL63 is illustrated in FIG. 6; however, the number of word lines is not limited thereto. The memory cell array 140 is a two-dimensional memory cell array.

Figure 7:
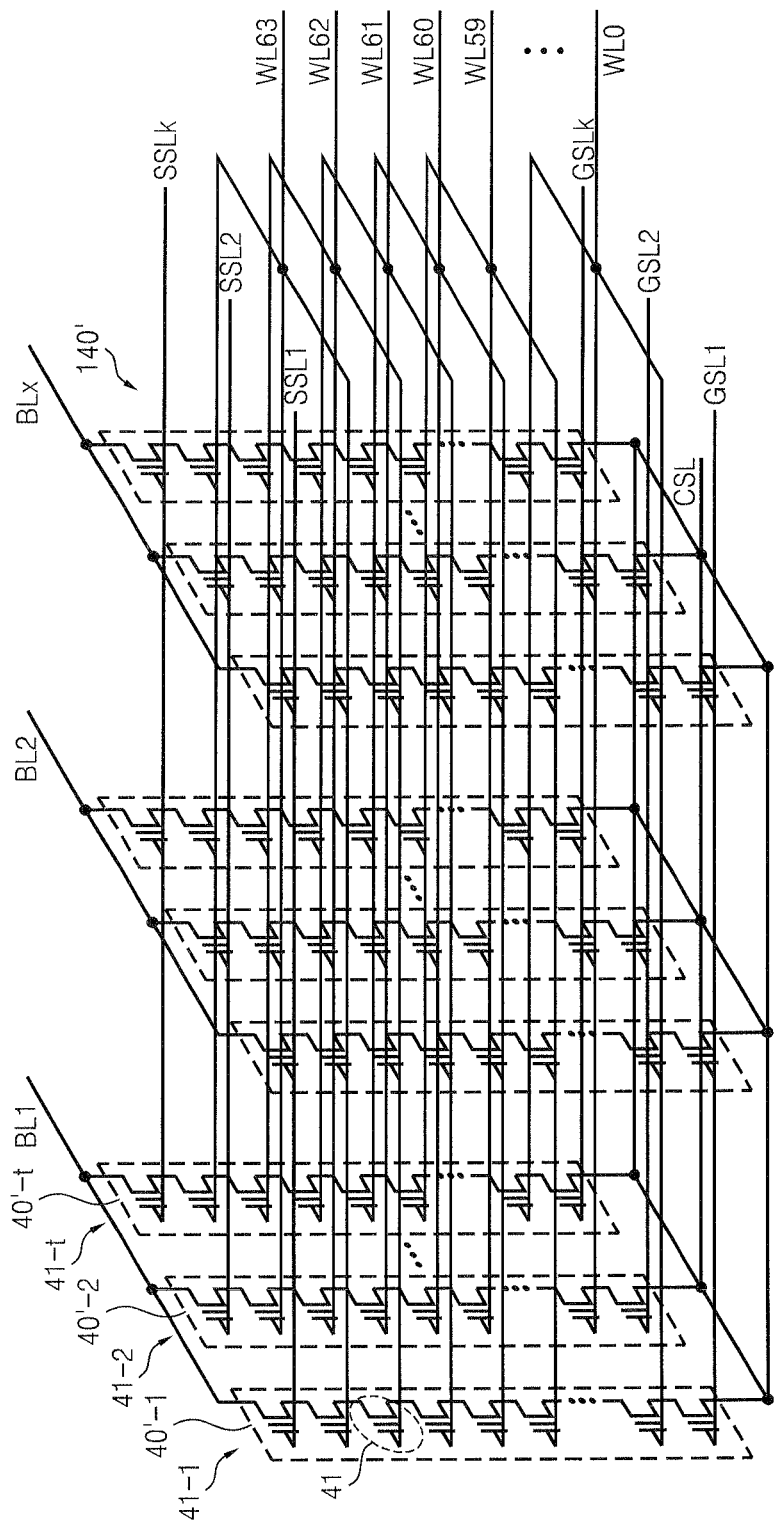
FIG. 7 is a block diagram of a non-volatile memory device which is illustrated in FIG. 1 and has a three-dimensional structure, according to an exemplary embodiment of the present inventive concept.

FIG. 7 is a block diagram of a non-volatile memory device which is illustrated in FIG. 1 and has a three-dimensional structure, according to an exemplary embodiment of the present inventive concept. As illustrated in FIGS. 1 and 7, a memory cell array 140' includes a plurality of NAND memory cell strings, each NAND memory cell string 40'-1, 40'-2, . . . , 40'-t, where t is a natural number, may be disposed on three-dimensionally different planes. The memory cell array 140' is a three-dimensional memory cell array.

As illustrated in FIG. 7, a first NAND memory cell string 40'-1 may be disposed on a first layer 41-1, a second NAND memory cell string 40'-2 may be disposed on a second layer 41-2 which is different from the first layer 41-1, and a $t^{th}$ NAND memory cell string 40'-t may be disposed on a $t^{th}$ layer 41-t which is different from the second layer 41-2.

The plurality of layers 41-1 through 41-t may be formed through a wafer stack, a chip stack or a cell stack. The plurality of layers 41-1 through 41-t may be connected to each other through an electrical vertical element including a through-silicon via (TSV), a pump or wire bonding. Each of the plurality of layers 41-1 through 41-t includes a plurality of cell strings.

As illustrated in FIG. 7, each NAND memory cell string 40'-1, 40'-2, . . . , 40'-t may share a plurality of word lines WL0 through WL63, a common source line CSL and bit lines BL1 to BLx. The memory cell array 140' may include a plurality of string selection lines SSL1 to SSLk and a plurality of ground selection lines GSL1 to GSLk.

The following description refers to the two-dimensional memory cell array 140 illustrated in FIG. 6; however, the following description is applicable to the three-dimensional memory cell array 140' illustrated in FIG. 7.

The control logic 43 which may be embodied in a circuit, logic, a code or a combination of these controls a data processing operation, e.g., a program operation or a write operation, a read operation and an erase operation, of the NAND flash memory device 140. For example, the control logic 43 controls an operation of each element 44 through 49 to perform the data processing operation according to a plurality of control signals output from the memory controller 20.

The voltage generator 44 may generate a plurality of voltages including a program voltage for performing a program operation or a write operation, a plurality of voltages including a read voltage for performing a read operation, or a plurality of voltages including an erase voltage for performing an erase operation. The voltage generator 44 may output a plurality of voltages for each operation to the row decoder 45.

The row decoder 45 provides a plurality of voltages output from the voltage generator 44 to the plurality of word lines WL0 through WL63 according to a row address output from the control logic 43. The column decoder 47 decodes a column address under a control of the control logic 43 and outputs a plurality of selection signals to the Y-gating circuit 48. A page buffer block 46 includes a plurality of page buffers. Each of the plurality of page buffers is connected to a respective one of a plurality of bit lines BL1 through BLx, where x is a natural number.

Each of the plurality of page buffers may operate as a driver for programming data in the memory cell array 140 during a program operation according to a control of the control logic 43. In addition, each of the plurality of page buffers may operate as a sense-amplifier which may sense-amplify a voltage level of each of the plurality of bit lines BL1 through BLx during a read operation or a verify operation according to a control of the control logic 43.

The Y-gating circuit 48 may control transmission of data between the page buffer block 46 and the input/output block 49 in response to a plurality of selection signals output from the column decoder 47.

The input/output block 49 may transmit data input from the memory controller 20 to the Y-gating circuit 48 or transmit data output from the Y-gating circuit 48 to the memory controller 20 through a plurality of input/output pins or a data bus.

Figure 8:
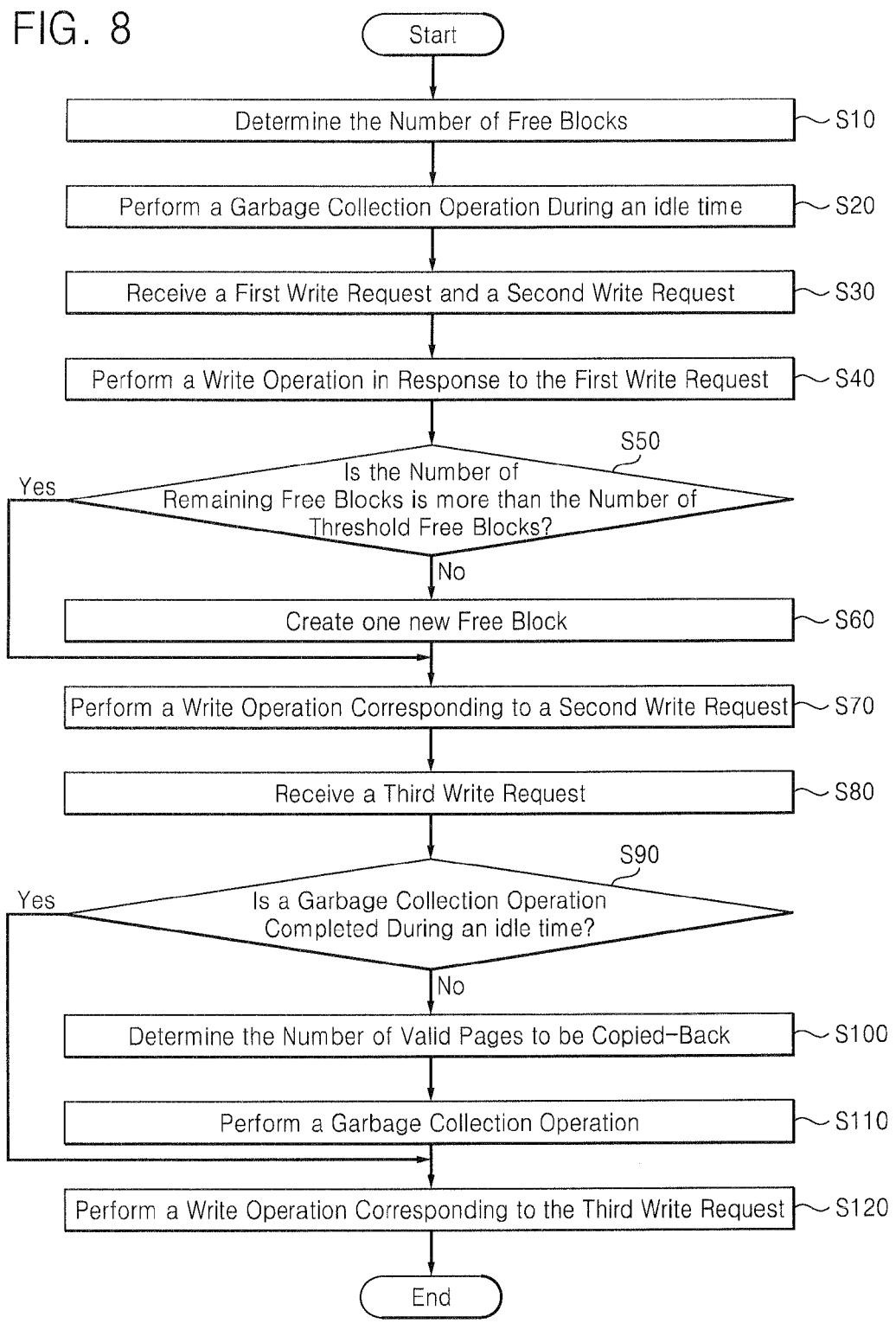
FIG. 8 is a flowchart for explaining a method for operating the memory controller illustrated in FIG. 1, according to an exemplary embodiment of the present inventive concept.

FIG. 8 is a flowchart for explaining a method for operating the memory controller illustrated in FIG. 1, according to an exemplary embodiment of the present inventive concept. Referring to FIGS. 1 through 6 and 8, the memory controller 20 determines the number of free blocks to be created during an idle time, e.g., IT1, IT2, IT3 or IT4, by using a block consumption history (S10). The block consumption history includes information regarding the number of blocks consumed before the idle time.

The memory controller 20 controls the non-volatile memory device 40 so that a garbage collection operation may be performed during the idle time to create the determined number of free blocks (S20). After an idle time (e.g., IT3 in FIG. 3), the memory controller 20 may receive a first write request and a second write request from a host (S30).

The memory controller 20 controls a write operation in response to the first write request (S40). In other words, the memory controller 20 controls the non-volatile memory device 40 so that a portion of the created free blocks may be consumed. The memory controller 20 determines if the number of remaining free blocks is greater than the number THB of threshold free blocks (S50).

When the number of remaining free blocks is less than the number THB of threshold free blocks, the memory controller 20 controls the non-volatile memory device 40 so that one new free block may be created during a write time (e.g., WR5 in FIG. 3) (S60). In other words, a garbage collection operation is performed so that the one new free block may be created.

After generating the one new free block, the memory controller 20 controls a write operation corresponding to the second write request during the write time WR5 (S70). The garbage collection operation and the write operation may be iteratively performed during the write time WR5. The memory controller 20 performs a garbage collection operation during an idle time (e.g., IT4 in FIG. 3). The memory controller 20 may receive a third write request from a host while the garbage collection operation is performed during the idle time IT4 (S80).

The memory controller 20 determines if the garbage collection operation is completed during the idle time IT4 (S90). When the garbage collection operation is not completed during the idle time IT4, the memory controller 20 determines the number of valid pages to be copied-back to create the number FB of free blocks which had not yet been created during a write time WR6 (S100). The memory controller 20 collects the valid pages which may be as many as the determined number of valid pages (S110).

The memory controller 20 controls a write operation corresponding to the third write request after collecting the valid pages (S120).

Figure 9:
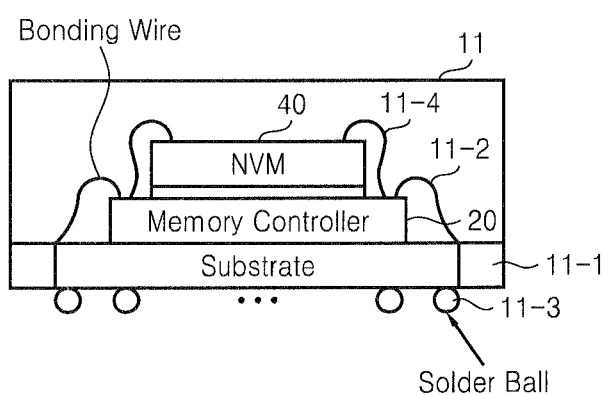
FIG. 9 is a multi-chip package including the memory system illustrated in FIG. 1, according to an exemplary embodiment of the present inventive concept.

FIG. 9 is a multi-chip package including the memory system illustrated in FIG. 1, according to an exemplary embodiment of the present inventive concept. Referring to FIG. 9, a multi-chip package 11 includes the memory controller 20 mounted or stacked on a circuit substrate 11-1, e.g., a printed circuit board (PCB), and the non-volatile memory device 40 mounted or stacked on the memory controller 20. The memory controller 20 may communicate with an external device through bonding wires 11-2 and solder balls 11-3. In addition, the memory controller 20 and the non-volatile memory device 40 may communicate with each other through bonding wires 11-4.

For convenience of explanation, in FIG. 9 the non-volatile memory device 40 is formed on the memory controller 20;

however, a location of the two devices 20 and 40 may be changed according to an exemplary embodiment of the present inventive concept.

In addition, the memory controller 20 and the non-volatile memory device 40 may communicate with each other through connection means other than the bonding wires 11-4, and the memory controller 20 and the solder balls 11-3 may be connected to each other through connection means other than the bonding wires 11-2. The connection means may be a vertical electrical element, e.g., a through silicon via (TSV).

Figure 10:
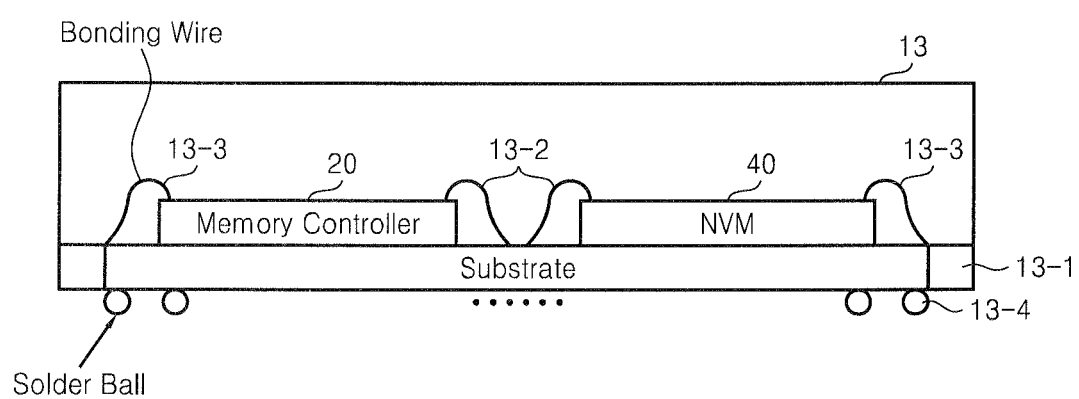
FIG. 10 is a multi-chip package including the memory system illustrated in FIG. 1, according to an exemplary embodiment of the present inventive concept.

FIG. 10 is a multi-chip package including the memory system illustrated in FIG. 1, according to an exemplary embodiment of the present inventive concept.

Referring to FIG. 10, a multi-chip package 13 includes the memory controller 20 and the non-volatile memory device 40 which are connected on a circuit substrate 13-1, e.g., a PCB. The memory controller 20 and the non-volatile memory device 40 communicate with each other through bonding wires 13-2, and each of the memory controller 20 and the non-volatile memory device 40 may communicate with an external device through bonding wires 13-3 and solder balls 13-4.

According to an exemplary embodiment of the present inventive concept, the memory controller 20 and the non-volatile memory device 40 may communicate with each other through connection means other than the bonding wires 13-2. The connection means may be a vertical electrical element, e.g., a through silicon via (TSV).

For example, if each of the memory controller 20 and the non-volatile memory device 40 is connected to the circuit substrate 13-1 through the vertical electrical elements, the memory controller 20 and the non-volatile memory device 40 may communicate with each other through the vertical electrical elements and the circuit substrate 13-1.

The memory controller 20 and the non-volatile memory device 40 which are each embodied in a chip may be embodied in a package such as a Package On Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), CERamic Dual In-Line Package (CERDIP), plastic metric quad flat pack (MQFP), Thin Quad Flat Pack (TQFP), small-outline integrated circuit (SOIC), shrink small outline package (SSOP), thin small outline package (TSOP), system in package (SIP), multi chip package (MCP), wafer-level fabricated package (WFP), wafer-level processed stack package (WSP) or the like.

Figure 11:
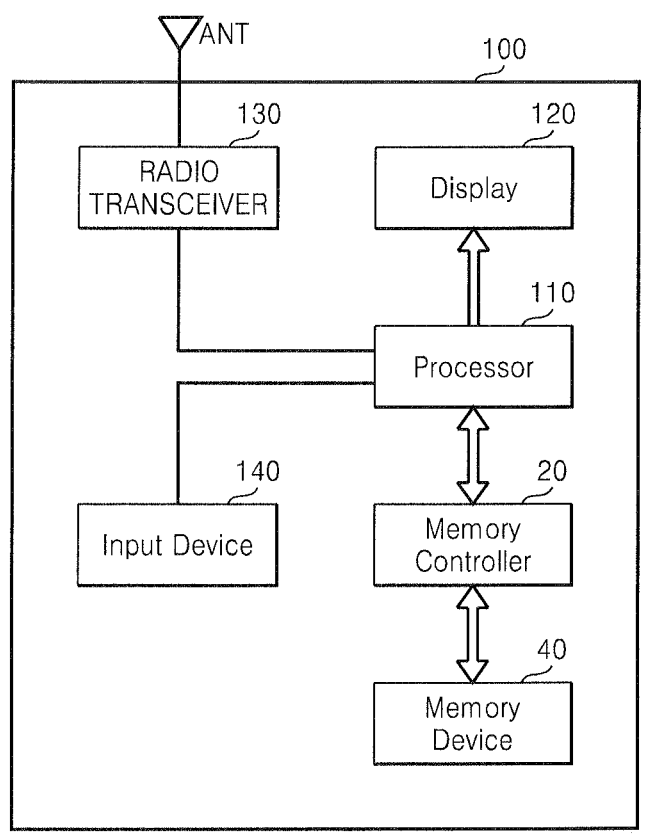
FIG. 11 is an electronic device including the memory system illustrated in FIG. 1, according to an exemplary embodiment of the present inventive concept.

FIG. 11 is an electronic device including the memory system illustrated in FIG. 1, according to an exemplary embodiment of the present inventive concept. Referring to FIGS. 1 and 11, an electronic device 100 may be embodied in a cellular/mobile phone, a smart phone, a tablet personal computer (PC), a personal digital assistant (PDA), a video game console, or a handheld communication device.

The electronic device 100 includes the memory controller 20 and the non-volatile memory device 40. The memory controller 20 may control a data processing operation, e.g., a program operation or a write operation, an erase operation or a read operation, of the non-volatile memory device 40 according to a control of a processor 110.

Data programmed in the non-volatile memory device 40 may be displayed through a display 120 according to a control of the processor 110 and/or the memory controller 20. The display 120 may be embodied in a flat panel display such as a thin film transistor-liquid crystal display (TFT-LCD), a light-emitting diode (LED) display, an organic LED (OLED) display, or an active matrix OLED (AMOLED) display.

A radio transceiver 130 may transmit or receive a radio signal through an antenna ANT. For example, the radio transceiver 130 may change a radio signal received through the antenna ANT into a signal which may be processed by the processor 110. Accordingly, the processor 110 may process a signal output from the radio transceiver 130 and transmit the processed signal to the memory controller 20 or the display 120. The memory controller 20 according to an exemplary embodiment of the present inventive concept may program the signal processed by the processor 110 in the non-volatile memory device 40. In addition, the radio transceiver 130 may change a signal output from the processor 110 into a radio signal, and output the changed radio signal to an external device through the antenna ANT.

An input device 140 of the electronic device 100 may be a pointing device such as a touch pad and a computer mouse, a keypad or a keyboard or a device which may input a control signal for controlling an operation of the processor 110 or data to be processed by the processor 110.

The processor 110 may control an operation of the display 120 so that data output from the memory controller 20, data output from the radio transceiver 130 or data output from the input device 140 may be displayed through the display 120. According to an exemplary embodiment of the present inventive concept, the memory controller 20 which may control an operation of the non-volatile memory device 40 may be embodied in a portion of the processor 110 or a chip which is separate from the processor 110.

Figure 12:
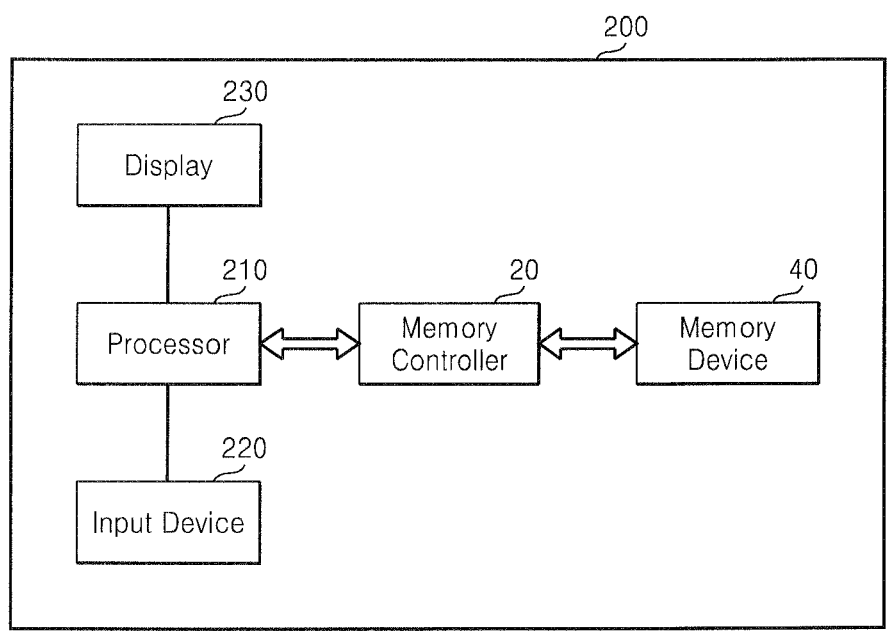
FIG. 12 is an electronic device including the memory system illustrated in FIG. 1, according to an exemplary embodiment of the present inventive concept.

FIG. 12 is an electronic device including the memory system illustrated in FIG. 1, according to an exemplary embodiment of the present inventive concept. An electronic device 200 illustrated in FIG. 12 may be embodied in a PC, a laptop computer, a net-book, an e-reader, a portable multimedia player (PMP), an MP3 player or an MP4 player.

The electronic device 200 includes the non-volatile memory device 40 and the memory controller 20 which may control a data processing operation of the non-volatile memory device 40.

The processor 210 may display data stored in the non-volatile memory device 40 through a display 230 according to data input through an input device 220. For example, the input device 220 may be a pointing device such as a touch pad or a computer mouse, a keypad or a keyboard. In addition, the input device 220 may be an interface which may interface data with other devices.

The processor 210 may control a general operation of the electronic device 200 and an operation of the memory controller 20. According to an exemplary embodiment of the present inventive concept, the memory controller 20 which may control an operation of the non-volatile memory device 40 may be embodied in a portion of the processor 210 or a chip which is separate from the processor 210.

Figure 13:
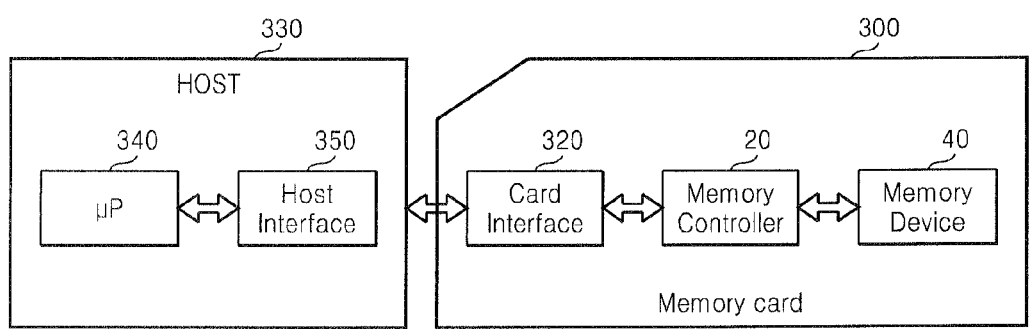
FIG. 13 is an electronic device including the memory system illustrated in FIG. 1, according to an exemplary embodiment of the present inventive concept.

FIG. 13 is an electronic device including the memory system illustrated in FIG. 1, according to an exemplary embodiment of the present inventive concept. For convenience of explanation, an electronic device 300 and a host 330 are illustrated together in FIG. 13. The electronic device 300 of FIG. 13 may be a memory card or a smart card. A memory card, which is an electronic flash memory data storage device used to store digital information, includes a PC card, a multimedia card (MMC), an embedded MMC (e-MMC), a secure digital (SD) card, or a universal serial bus (USB) flash drive.

The electronic device 300 embodied as a memory card includes the memory controller 20, the non-volatile memory device 40, and a card interface 320.

The memory controller 20 may control exchange of data between the non-volatile memory device 40 and the card interface 320. According to an exemplary embodiment of the present inventive concept, the card interface 320 may be an SD card interface or an MMC interface; however, it is not limited thereto.

The card interface 320 may interface data exchange between the host 330 and the memory controller 20 according to a protocol of the host 330. According to an exemplary embodiment of the present inventive concept, the card interface 320 may support a USB protocol, an InterChip (IC)-USB protocol, etc. Here, a card interface may be hardware which may support a protocol of the host 330, software installed in the hardware, or a signal transmission method.

When the electronic device 300 is connected to a host interface 350 of the host 330 such as a PC, a laptop computer, a tablet PC, a digital camera, a digital audio player, a mobile phone, a video game console, an MP3 player, a PMP, an e-book, or a digital set-top box, the host interface 350 may perform data communication with the non-volatile memory device 40 through the card interface 320 and the memory controller 20 according to a control of a micro-processor 340.

Figure 14:
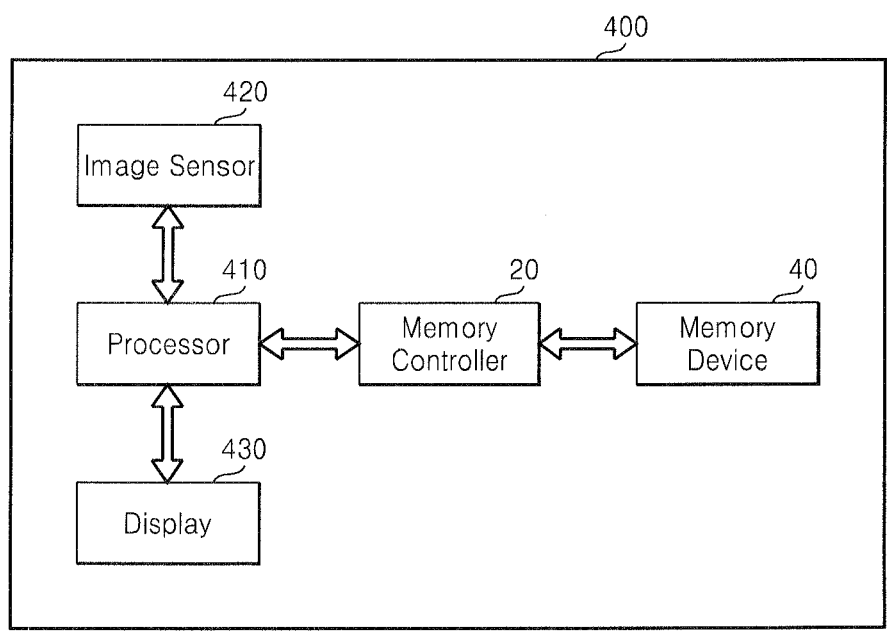
FIG. 14 is an electronic device including the memory system illustrated in FIG. 1, according to an exemplary embodiment of the present inventive concept.

FIG. 14 is an electronic device including the memory system illustrated in FIG. 1, according to an exemplary embodiment of the present inventive concept. An electronic device 400 illustrated in FIG. 14 may be an image processing device, e.g., a digital camera, a mobile phone equipped with a digital camera, a smart phone equipped with a digital camera, or a tablet PC equipped with a digital camera.

The electronic device 400 includes the non-volatile memory device 40 and the memory controller 20 which may control a data processing operation, e.g., a program operation or a write operation, an erase operation or a read operation, of the non-volatile memory device 40.

An image sensor 420 of the electronic device 400 converts an optical image into digital image signals, and the converted digital image signals are transmitted to a processor 410 and/or the memory controller 20. According to a control of the processor 410, the converted digital image signals may be displayed through a display 430 or stored in the non-volatile memory device 40 through the memory controller 20. In addition, data stored in the non-volatile memory device 40 are displayed through the display 430 according to a control of the processor 410 and/or the memory controller 20.

The memory controller 20 which may control an operation of the non-volatile memory device 40 according to an exemplary embodiment of the present inventive concept may be embodied in a portion of the processor 410 or a chip which is separate from the processor 410.

Figure 15:
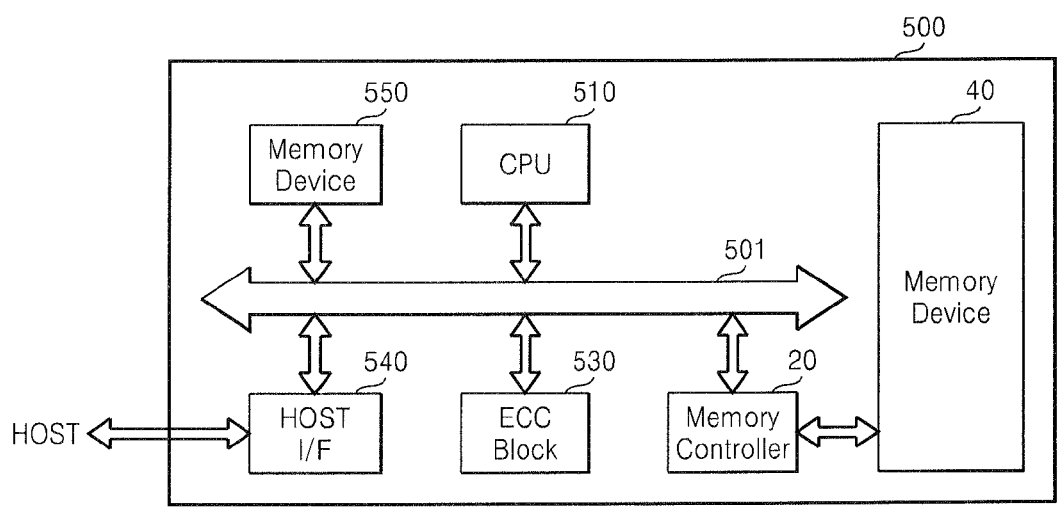
FIG. 15 is an electronic device including the memory system illustrated in FIG. 1, according to an exemplary embodiment of the present inventive concept.

FIG. 15 is an electronic device including the memory system illustrated in FIG. 1, according to an exemplary embodiment of the present inventive concept. Referring to FIG. 15, an electronic device 500 includes the non-volatile memory device 40 and the memory controller 20 which may control an operation of the non-volatile memory device 40.

The electronic device 500 includes a memory device 550 which may be used as an operation memory of a central processing unit (CPU) 510. The memory device 550 may be embodied in a non-volatile memory such as a ROM or a volatile memory such as a static random access memory (SRAM).

A host connected to the electronic device 500 may perform data communication with the non-volatile memory device 40 through the memory controller 20 and a host interface 540.

An ECC block 530 may detect an error bit which is included in data output from the non-volatile memory device 40 through the memory controller 20, correct the error bit, and transmit error-corrected data to a host through the host interface 540 according to a control of a CPU 510. The ECC block 530 may not be included in the electronic device 500 according to an exemplary embodiment of the present inventive concept.

The CPU 510 may control data communication among the memory controller 20, the ECC block 530, the host interface 540 and the memory device 550 through a bus 501.

The electronic device 500 may be a flash memory drive, a USB memory drive, an IC-USB memory drive or a memory stick.

Figure 16:
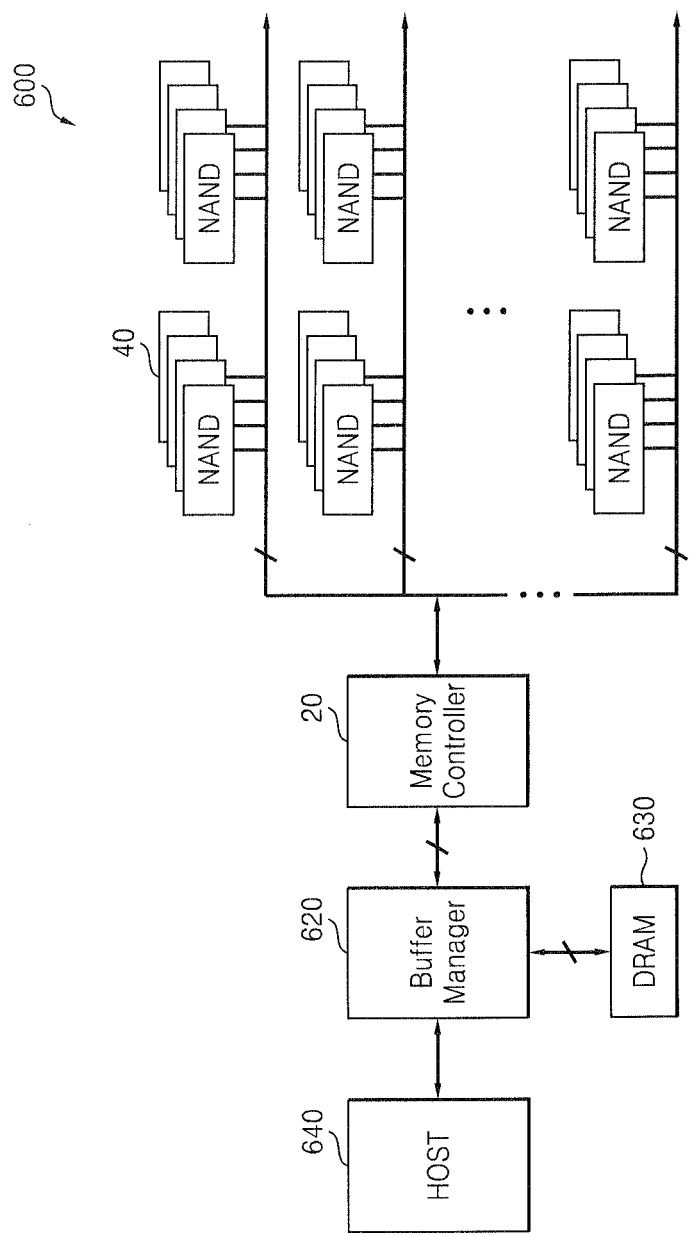
FIG. 16 is an electronic device including the memory system illustrated in FIG. 1, according to an exemplary embodiment of the present inventive concept.

FIG. 16 is an electronic device including the memory system illustrated in FIG. 1, according to an exemplary embodiment of the present inventive concept. Referring to FIG. 16, an electronic device 600 may be a data processing device such as a solid state drive (SSD).

The electronic device 600 includes a plurality of solid state memory devices 40, the memory controller 20, a volatile memory device 630 and a buffer manager 620. The memory controller 20 may control a data processing operation of each of the plurality of solid state memory devices 40. Each of the plurality of solid state memory devices 40 is a non-volatile memory device, e.g., a NAND flash memory device, illustrated in FIGS. 1 and 10, and includes memory blocks. The memory controller 20 may program data in a page included in one of the plurality of solid state memory devices 40.

The volatile memory device 630 may be a DRAM, and temporarily store data transmitted or received between the memory controller 20 and a host 640.

The buffer manager 620 may control a data buffering operation of the volatile memory device 630 and/or the memory controller 20.

Figure 17:
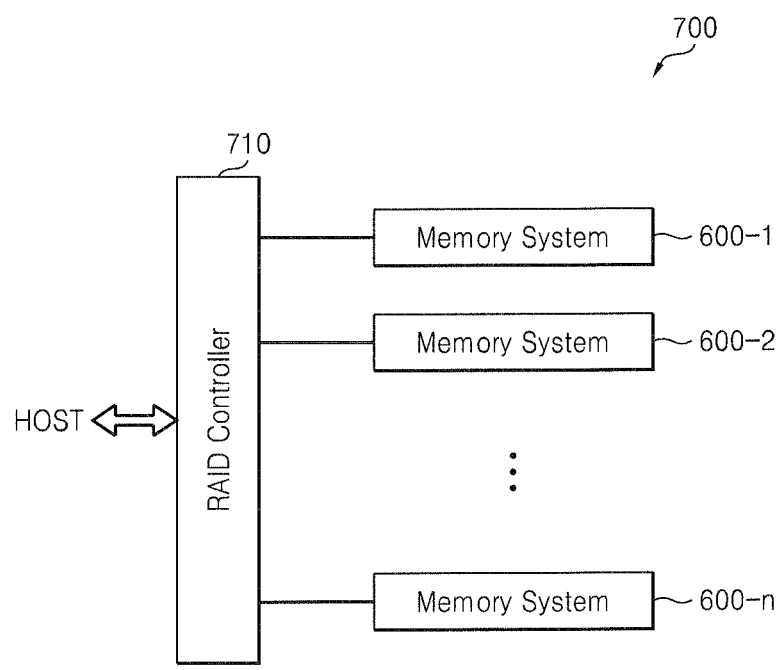
FIG. 17 is a block diagram of a data processing system including the electronic device illustrated in FIG. 16, according to an exemplary embodiment of the present inventive concept.

FIG. 17 is a block diagram of a data processing system including the electronic device illustrated in FIG. 16, according to an exemplary embodiment of the present inventive concept. Referring to FIGS. 16 and 17, a data processing device 700 which may be a redundant array of independent disks (RAID) system may include a RAID controller 710 and a plurality of electronic devices 600-1 through 600-$n$, where n is a natural number.

Each of the electronic devices 600-1 through 600-$n$ may be the electronic device 600 illustrated in FIG. 16. The plurality of electronic devices 600-1 through 600-$n$ may compose a RAID array. The data processing device 700 may be a PC, a network-attached storage (NAS) or an SSD. Each of the electronic devices 600-1 through 600-$n$ may be a memory system embodied in the form of a memory module.

During a program operation or a write operation, a RAID controller 710 may output data output from a host to at least one of the plurality of electronic devices 600-1 through 600-$n$ based on a RAID level according to a program request or a write request output from the host.

During a read operation, the RAID controller 710 may transmit data read from at least one of the plurality of electronic devices 600-1 through 600-$n$ to a host according to a read instruction output from the host.

A method for operating a memory controller according to an exemplary embodiment of the present inventive concept and a system having the memory controller may reclaim a response time of a read operation and a write operation by adaptively performing a garbage collection operation during an idle time through adaptive estimation of a workload.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A method of operating a memory controller for a non-volatile memory device, wherein the nonvolatile memory device includes a memory cell array and the memory cell array includes a plurality of memory blocks, the method comprising:
   determining, using the memory controller, a number of free memory blocks to be created during an idle time by using a block consumption history, wherein the idle time occurs between consecutive write requests, and wherein the block consumption history includes information on how many valid memory blocks were consumed in a write operation before the idle time; and
   controlling, using the memory controller, the non-volatile memory device to perform a garbage collection operation during the idle time to create the determined number of free memory blocks, wherein the garbage collection operation includes copying valid data from a first memory block to a second memory block and erasing the first memory block.

2. The method of claim 1, wherein determining the number of free memory blocks to be created comprises:
   reading, from the block consumption history, information regarding a number of memory blocks consumed by write operations during write times; and
   determining the number of the free memory blocks to be created based on the read information.

3. The method of claim 1, further comprising:
   receiving, at the memory controller, a first write request and a second write request;
   controlling, using the memory controller, the non-volatile memory device to consume a portion of the created free memory blocks in response to the first write request;
   controlling, using the memory controller, the non-volatile memory device to create one new free memory block when the number of remaining free memory blocks is equal to or less than a number of threshold free memory blocks; and
   controlling, using the memory controller, the non-volatile memory device to perform a write operation corresponding to the second write request after the one new free memory block is created.

4. The method of claim 1, further comprising:
   receiving, at the memory controller, a first write request before the determined number of free memory blocks are all created;
   determining, using the memory controller, a number of valid pages to be copied-back when the number of free memory blocks created during the idle time is not as many as the determined number of free memory blocks to be created during the idle time;
   controlling, using the memory controller, the non-volatile memory device to collect the determined number of valid pages to be copied-back; and
   controlling, using the memory controller, the non-volatile memory device to perform a write operation corresponding to the first write request after the valid pages to be copied-back are collected.

5. The method of claim 4, wherein determining the number of the valid pages to be copied-back comprises:
   multiplying a number of average valid pages per victim block by a number of the free memory blocks which had not been created; and
   determining a result of the multiplication as the number of the valid pages to be copied-back.

6. A memory system, comprising:
   a non-volatile memory device including a memory cell array, wherein the memory cell array includes a plurality of memory blocks; and
   a memory controller configured to control the non-volatile memory device,
   wherein the memory controller comprises:
   a memory storing firmware which determines a number of free memory blocks to be created during an idle time by using a block consumption history, and controls the non-volatile memory device to perform a garbage collection operation during the idle time to create the determined number of free memory blocks; and
   a micro-processor configured to execute the firmware,
   wherein the idle time occurs between consecutive write requests, and wherein the block consumption history includes information on how many valid memory blocks were consumed in a write operation before the idle time,
   wherein the garbage collection operation includes copying valid data from a first memory block to a second memory block and erasing the first memory block.

7. The memory system of claim 6, wherein the memory stores the block consumption history.

8. The memory system of claim 6, wherein the block consumption history is loaded from the non-volatile memory device to the memory.

9. The memory system of claim 6, wherein the firmware is loaded from the non-volatile memory device to the memory.

10. The memory system of claim 6, wherein the non-volatile memory device is a three-dimensional non-volatile memory device.

11. The memory system of claim 6, wherein the memory system is a handheld electronic device.

12. The memory system of claim 6, wherein the memory system is a memory card.

13. The memory system of claim 6, wherein the memory system is a solid state drive.

14. A method of operating a memory controller for a non-volatile memory device, wherein the nonvolatile memory device includes a memory cell array and the memory cell array includes a plurality of memory blocks, the method comprising:
   determining a number of free memory blocks to be created, wherein the determination occurs between consecutive write requests in an idle time of the nonvolatile memory device, wherein the number of free memory blocks to be created is based on valid blocks used in a previous write operation; and
   instructing a non-volatile memory device to create the determined number of free memory blocks in the idle time so that enough memory is available in a next write operation after the idle time.

15. The method of claim 14, wherein the idle time is a time when the non-volatile memory device does not perform an operation under control of the memory controller.

16. The method of claim 14, further comprising:
   instructing the non-volatile memory device to create one new free memory block when a number of free memory blocks remaining after performing a first write operation is less than a predetermined threshold; and
   instructing the non-volatile memory device to perform a second write operation on the one new free memory block.

17. The method of claim 14, further comprising:
   receiving a first write request before all of the determined number of free memory blocks are created;

determining a number of valid pages to be copied-back to a memory block based on a number of free memory blocks needed to reach the determined number of free memory blocks; and controlling the non-volatile memory device to perform the first write request on the memory block.

18. The method of claim 14, wherein the free memory blocks are valid memory blocks where data may be programmed.

* * * * *